(12) United States Patent
Kravitz

(10) Patent No.: US 8,711,905 B2
(45) Date of Patent: Apr. 29, 2014

(54) CALIBRATION OF QUADRATURE IMBALANCES USING WIDEBAND SIGNALS

(75) Inventor: Lior Kravitz, Kfar Bilu (IL)

(73) Assignee: Intel Corporation, Santa Clara, CA (US)

( * ) Notice: Subject to any disclaimer, the term of this patent is extended or adjusted under 35 U.S.C. 154(b) by 414 days.

(21) Appl. No.: 12/800,995

(22) Filed: May 27, 2010

(65) Prior Publication Data

US 2011/0292978 A1      Dec. 1, 2011

(51) Int. Cl.
    *H04B 1/38*       (2006.01)
(52) U.S. Cl.
    USPC ......................................................... 375/219
(58) Field of Classification Search
    USPC .......... 370/210, 329, 409, 478, 484; 375/219,
                  375/221, 241, 295, 299, 341; 455/135,
                  455/233.1, 318; 701/213; 725/105
    See application file for complete search history.

(56) References Cited

U.S. PATENT DOCUMENTS

| | | | |
|---|---|---|---|
| 5,321,726 | A | 6/1994 | Kafadar |
| 6,222,878 | B1 | 4/2001 | McCallister et al. |
| 6,229,992 | B1 | 5/2001 | McGeehan et al. |
| 6,940,916 | B1 * | 9/2005 | Warner et al. ................. 375/261 |
| 7,010,059 | B2 * | 3/2006 | Song et al. ..................... 375/316 |
| 7,020,220 | B2 | 3/2006 | Hansen |
| 7,088,765 | B1 | 8/2006 | Green et al. |
| 7,181,205 | B1 | 2/2007 | Scott et al. |
| 7,184,714 | B1 * | 2/2007 | Kutagulla et al. ............... 455/73 |
| 7,187,725 | B2 | 3/2007 | Song et al. |
| 7,248,654 | B2 | 7/2007 | Song et al. |
| 7,567,611 | B2 | 7/2009 | Chien |
| 8,014,366 | B2 | 9/2011 | Wax et al. |
| 8,036,319 | B2 | 10/2011 | Arambepola et al. |
| 8,036,606 | B2 | 10/2011 | Kenington |
| 8,478,222 | B2 | 7/2013 | Wortel et al. |

(Continued)

FOREIGN PATENT DOCUMENTS

| | | |
|---|---|---|
| CN | 1201299 A | 12/1998 |
| CN | 1483268 A | 3/2004 |

(Continued)

OTHER PUBLICATIONS

Cavers, James K., "The Effect of Quadrature Modulator and Demodulator Errors on Adaptive Digital Predistorters for Amplifier Linearization", IEEE Transactions on Vehicular Technology, vol. 46, No. 2, May 1997, pp. 456-466.

(Continued)

*Primary Examiner* — Jean B Corrielus
*Assistant Examiner* — Shawkat M Ali
(74) *Attorney, Agent, or Firm* — Schubert Law Group PLLC

(57) ABSTRACT

Calibration of quadrature imbalance in direct conversion transceivers is contemplated. A transceiver controller may perform a self-calibration to address quadrature imbalance. The controller may couple the radio frequency (RF) section of the transmitter to the RF section of the receiver via a loopback path and transfer a wideband signal into the transmitter. In the loopback path, the controller may phase-shift the wideband signal that propagates through the transmitter using two different phase angles to produce two different signals that propagate into the receiver. By measuring the transmitter and receiver signals, and performing a Fast Fourier Transform calculation, the controller may be able to calculate correction coefficients, or parameters, which may be used to adjust elements that address or correct the quadrature imbalance for both the transmitter and receiver.

18 Claims, 5 Drawing Sheets

(56) References Cited

U.S. PATENT DOCUMENTS

| | | | |
|---|---|---|---|
| 2002/0090909 A1* | 7/2002 | Dapper et al. | 455/3.01 |
| 2002/0115416 A1* | 8/2002 | Riou et al. | 455/115 |
| 2003/0031273 A1 | 2/2003 | Mohindra | |
| 2003/0045249 A1 | 3/2003 | Nielsen | |
| 2003/0223480 A1* | 12/2003 | Cafarella | 375/219 |
| 2004/0087279 A1* | 5/2004 | Muschallik et al. | 455/73 |
| 2005/0123064 A1 | 6/2005 | Ben-Ayun et al. | |
| 2006/0063497 A1 | 3/2006 | Nielsen | |
| 2007/0298733 A1 | 12/2007 | Cole et al. | |
| 2008/0025381 A1 | 1/2008 | Lee et al. | |
| 2008/0165874 A1 | 7/2008 | Steele et al. | |
| 2008/0166985 A1* | 7/2008 | Wortel et al. | 455/233.1 |
| 2008/0212711 A1* | 9/2008 | Auranen et al. | 375/295 |
| 2008/0219386 A1 | 9/2008 | Chrabieh et al. | |
| 2009/0052556 A1* | 2/2009 | Fernandez | 375/241 |
| 2009/0116586 A1 | 5/2009 | Arambepola et al. | |
| 2009/0319279 A1 | 12/2009 | Kong et al. | |
| 2011/0026567 A1* | 2/2011 | Sampath et al. | 375/219 |

FOREIGN PATENT DOCUMENTS

| | | |
|---|---|---|
| CN | 101622845 A | 1/2010 |
| EP | 2088681 A2 | 8/2009 |
| JP | 10327209 A | 12/1998 |
| JP | 2004173281 A | 6/2004 |
| JP | 2006526348 A | 11/2006 |
| JP | 200822243 A | 1/2008 |
| JP | 2008516536 A | 5/2008 |
| JP | 200944525 A | 2/2009 |
| JP | 2010516112 A | 5/2010 |
| WO | 2006044372 A2 | 4/2006 |
| WO | 2006044372 A3 | 4/2006 |
| WO | 2008086125 A2 | 7/2008 |
| WO | 2008086125 A3 | 7/2008 |
| WO | 2009/082457 A1 | 7/2009 |
| WO | 2011/037714 A2 | 3/2011 |
| WO | 2011/037714 A3 | 6/2011 |

OTHER PUBLICATIONS

Mutha, Shashank et al., "Technique for Joint Balancing of IQ Modulator-Demodulator Chains in Wireless Transmitters", IEEE Microwave Symposium Digest, 2009. MTT'09. IEEE MTT-S International Microwave Symposium, Boston, MA, Jun. 7-12, 2009, pp. 221-224.

Debaillie et al. "Calibration of SDR circuit imperfections", IEEE Global Telecommunications Conference, New Orleans, LA, USA, Nov. 30, 2008-Dec. 4, 2008, 5 pages.

International Search Report and Written Opinion received for PCT Patent Application PCT/US2010/046633, mailed on Apr. 15, 2011, 8 pages.

International Preliminary Report on Patentability and Written Opinion Received for PCT application PCT/US2010/046633, mailed on Apr. 5, 2012, 5 pages.

Office Action received for Chinese Patent Application No. 201010294291.1, mailed on Mar. 6, 2013, 9 pages of Office Action including 4 pages of English Translation.

Office Action received for Japanese Patent Application No. 2012-530895, mailed on Jun. 11, 2013, 9 pages of Office Action including 4 pages of English Translation.

Office Action received for Japanese Patent Application No. 2012-530895, mailed on Sep. 10, 2013, 7 pages of Office Action including 3 pages of English Translation.

Chen et al. "Adaptive I/Q Imbalance Compensation for RF Transceivers" (IEEE GLOBECOM 2004).

* cited by examiner

CALIBRATION OF QUADRATURE IMBALANCES USING WIDEBAND SIGNALS

FIELD

The embodiments herein are in the field of communications. More particularly, the embodiments relate to calibrating quadrature imbalances via wideband signals in direct conversion transceivers.

BRIEF DESCRIPTION OF THE DRAWINGS

Aspects of the embodiments will become apparent upon reading the following detailed description and upon reference to the accompanying drawings in which like references may indicate similar elements.

DETAILED DESCRIPTION OF EMBODIMENTS

Figure 1:
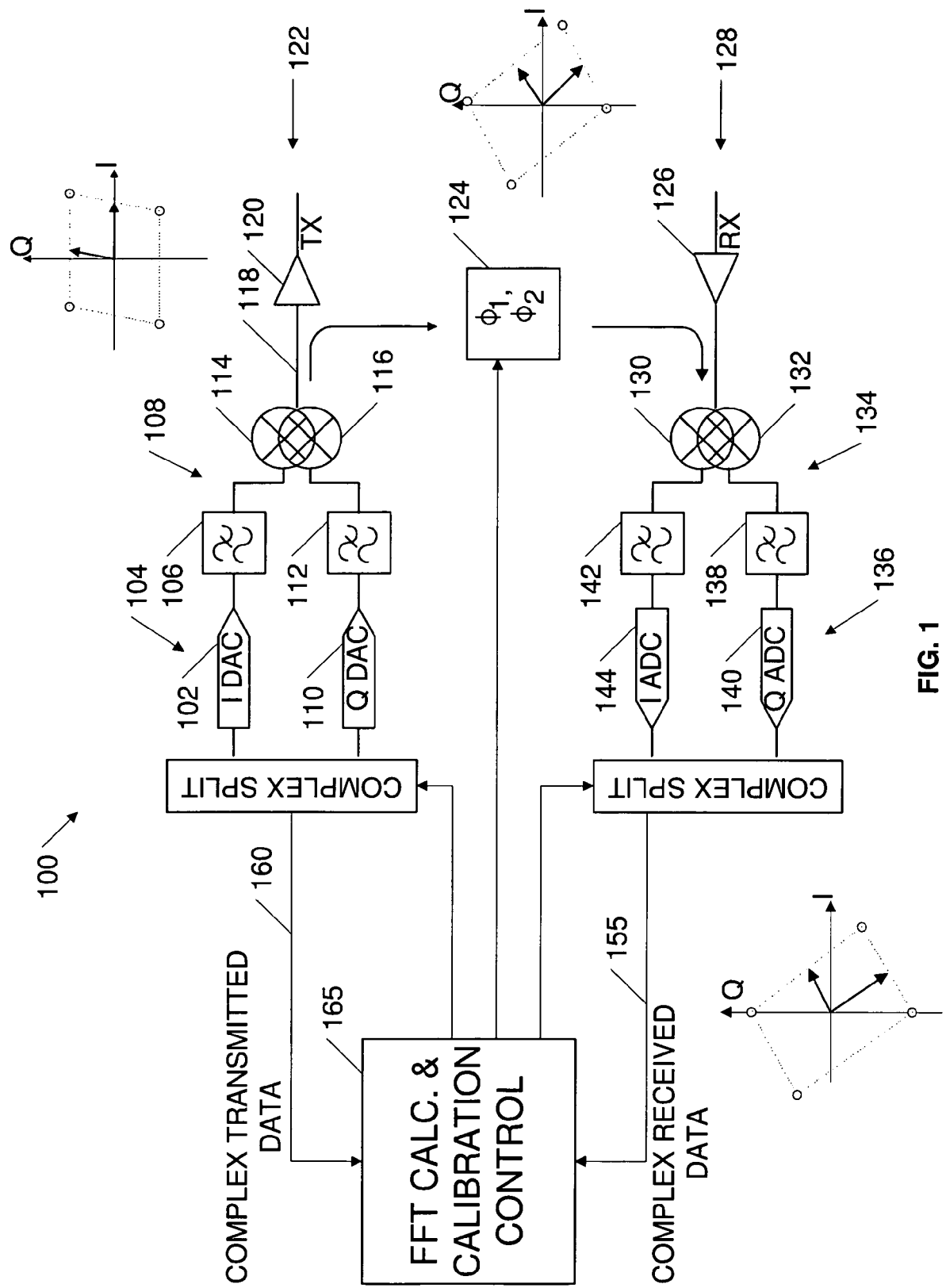
FIG. 1 illustrates generally how wideband signals may be used to calibrate quadrature imbalances in a direct conversion transceiver.

The following is a detailed description of embodiments depicted in the accompanying drawings. The specification is in such detail as to clearly communicate the embodiments. However, the amount of detail offered is not intended to limit the anticipated variations of embodiments. To the contrary, the intention is to cover all modifications, equivalents, and alternatives consistent with the spirit and scope of the embodiments as defined by the appended claims.

Wireless communications systems often transmit data using an in-phase (I) and quadrature (Q) format with the IQ signals being phased-shifted relative to each other by 90 degrees, which is known as a quadrature relationship. An IQ radio transceiver typically includes separate paths for the I-channel and the Q-channel, both in the transmitter and receiver.

Quadrature imbalance in the radio receiver or transmitter can impair the ability to successfully receive or transmit high speed data carried by the wireless signal. Quadrature imbalance may occur when the I-channel gain is different from that of the Q-channel, or when the phase relationship between the two channels is not exactly 90 degrees. In other words, quadrature imbalance is caused by gain and/or phase mismatches of the high frequency components in the I- and Q-channels of the IQ transceiver. For example, the receiver components in the I-channel can have slightly different amplitude and/or phase characteristics than the receiver components in the Q channel, introducing imbalance or mismatch errors in the I- and Q-baseband signals. Although the differences are usually small, these gain and phase imbalances reduce the effective signal-to-noise ratio of the IQ receiver, and increase the number of bit errors for a given data rate.

The state-of-the-art in low-cost, low-power wireless transceivers today is the direct conversion architecture. For example, direct conversion transceivers have reduced numbers of components by generally eliminating intermediate frequency stage components and use quadrature down-conversion of the desired channel signal from radio frequency (RF) directly to baseband. Unfortunately, the direct conversion architecture is also susceptible to quadrature imbalance. Due to the use of two physically separate baseband branches, and the generation of high-frequency quadrature signals (0° and 90°), the accuracy of the transmitted signal and the ability to receive accurately are limited by the degree of quadrature imbalance. Quadrature imbalance limits the Error Vector Magnitude (EVM) of the transceiver, which is especially critical in multiple-input and multiple-output (MIMO) systems.

Mass-produced radio frequency integrated circuit (RFIC) systems are usually manufactured in silicon using complementary metal-oxide-semiconductor (CMOS) processes. Variations in the CMOS manufacturing processes contribute greatly to the problem of quadrature imbalance. Transceivers may employ calibration to counter or minimize the effects of quadrature imbalance.

Electronic devices like personal computers, cellular telephones, and personal digital assistants (PDAs) may employ direct conversion receivers to communicate with Wireless Personal Area Networks (WPANs) and Wireless Local Area Networks (WLANs). Additionally, network devices like Wireless Access Points (WAPs) and network routers may also employ direct conversion receivers and direct conversion transmitters to communicate with other devices in the network. The embodiments herein may serve to address quadrature imbalance problems in numerous types of direct conversion transceivers, including transceivers in the electronic devices noted above.

Generally speaking, methods, apparatuses, and systems that employ wideband signals to calibrate quadrature imbalance in direct conversion transceivers are contemplated. An example system embodiment may be a wireless communication device in a local area network, such as a router which includes hardware for a wireless access point. The wireless communication device may have a direct conversion transceiver configured to communicate with a variety of wireless networking devices.

During a power-on sequence, or alternatively while online and operating, the wireless communication device may perform a self-calibration to address quadrature imbalance. The wireless communication device may couple the RF section of the transmitter to the RF section of the receiver via a loopback path, injecting the wideband signal of the transmitter into the receiver. In the loopback path, the wireless communication device may shift the phase of the wideband signal using two different phase angles to produce two different signals that exit the RF section of the receiver. By sampling the two different wideband signals that exit the receiver, and converting the received signals from the time domain to the frequency domain, the wireless communication device may be able to calculate correction coefficients, or parameters, which may be used to adjust elements that address or correct the quadrature imbalance for both the transmitter and receiver.

A method embodiment may involve a wireless networking station or other communication device which employs a direct conversion transceiver and performs a calibration to correct quadrature imbalance. The communication device may generate a wideband signal for its transmitter. The transmitter signal, produced by the propagation of the wideband signal through the transmitter, may have quadradure imbalance due to a mismatch of elements in the transmitter.

The communication device may continue by generating a first signal with a first phase shift and a second signal with a second phase shift, the phase shift of each signal being different or not equal. For example, the communication device may direct the transmitter signal which exits the RF portion of the transmitter and shift the signal by a first phase angle by circuitry in a loopback path coupled to the receiver. The communication device may continue by storing parameters of in-phase and quadrature signals from the transmitter and the receiver, with the in-phase and quadrature signals from receiver derived from the two phase-shifted signals. Using the stored parameters, the communication device may calculate correction parameters for quadrature imbalance via one or more Fourier transform calculations.

An embodiment of an apparatus may comprise a phase shifting module, a measurement module, a Fourier transform module, and a calibration module. The phase-shifting module may take a wideband signal from a transmitter, generate two phase-shifted signals with two different phase angles from the wideband signal, and transfer the two phase-shifted signals to a receiver via a loopback path which couples the analog sections of the receiver and transmitter.

The measurement module may store parameters of in-phase and quadrature signals from the first and second phase-shifted signals from the transmitter and the receiver. The Fourier transform module may use the measured parameters to calculate another set of parameters. The calibration module may then use the Fourier transform-derived parameters to calculate correction parameters for quadrature imbalance.

A system embodiment may comprise a cellular telephone, a wireless networking device, or other communication device employing a direct conversion transceiver coupled to an antenna. A phase-shifting module of the system may receive a wideband transmitter signal and generate two phase-shifted signals, each having a different phase angle. The phase-shifting module transfers the two phase-shifted signals to the receiver via at least one loopback path.

The system includes a measurement module that stores parameters of in-phase and quadrature signals, sampled from the two phase-shifted signals, from the digital sections of the transmitter and receiver. A Fourier transform module is configured to calculate another set of parameters based on the first set of parameters. A calibration module calculates correction parameters for quadrature imbalance based on the parameters calculated by the Fourier transform module.

Various embodiments disclosed herein may be used in a variety of applications. Some embodiments may be used in conjunction with various devices and systems, for example, a transmitter, a receiver, a transceiver, a transmitter-receiver, a wireless communication station, a wireless communication device, a wireless Access Point (AP), a modem, a wireless modem, a Personal Computer (PC), a desktop computer, a mobile computer, a laptop computer, a notebook computer, a tablet computer, a server computer, a handheld computer, a handheld device, a Personal Digital Assistant (PDA) device, a handheld PDA device, a network, a wireless network, a Local Area Network (LAN), a Wireless LAN (WLAN), a Metropolitan Area Network (MAN), a Wireless MAN (WMAN), a Wide Area Network (WAN), a Wireless WAN (WWAN), devices and/or networks operating in accordance with existing IEEE 802.16e, 802.20, 3 GPP Long Term Evolution (LTE) etc. and/or future versions and/or derivatives and/or Long Term Evolution (LTE) of the above standards, a Personal Area Network (PAN), a Wireless PAN (WPAN), units and/or devices which are part of the above WLAN and/or PAN and/or WPAN networks, one way and/or two-way radio communication systems, cellular radio-telephone communication systems, a cellular telephone, a wireless telephone, a Personal Communication Systems (PCS) device, a PDA device which incorporates a wireless communication device, a Multiple Input Multiple Output (MIMO) transceiver or device, a Single Input Multiple Output (SIMO) transceiver or device, a Multiple Input Single Output (MISO) transceiver or device, a Multi Receiver Chain (MRC) transceiver or device, a transceiver or device having "smart antenna" technology or multiple antenna technology, or the like.

Some embodiments may be used in conjunction with one or more types of wireless communication signals and/or systems, for example, Radio Frequency (RF), Frequency-Division Multiplexing (FDM), Orthogonal FDM (OFDM), Orthogonal Frequency-Division Multiple Access (OFDMA), Time-Division Multiplexing (TDM), Time-Division Multiple Access (TDMA), Extended TDMA (E-TDMA), Code-Division Multiple Access (CDMA), Multi-Carrier Modulation (MCM), Discrete Multi-Tone (DMT), Bluetooth®, ZigBee™, or the like. Embodiments may be used in various other apparatuses, devices, systems and/or networks.

Turning now to the drawings, FIG. 1 depicts a direct conversion transceiver 100 having a transmitter 122 and a receiver 128. For example, one or more embodiments of direct conversion transceiver 100 may implement a communication protocol that employs OFDM signals, including 802.11a/g/n (WiFi), 802.16d/e/m (WiMAX), and 3GPP Rel. 8/9 (LTE).

Receiver 128 is a direct conversion receiver having an amplifier 126. Mixer 130, low-pass filter 142, and analog-to-digital converter (ADC) 144 comprise an I-channel path, while mixer 132, low-pass filter 138, and ADC 140 comprise a Q-channel path. As people possessing ordinary skill in the art will appreciate, numerous elements of transceiver 100 have been omitted from FIG. 1, for the sake of simplicity and ease in understanding. For example, local oscillators at the mixer stages, multiplexers, and digital signal processing (DSP) elements coupled to the ADCs and digital-to-analog converters (DACs) are just some of the elements not depicted in FIG. 1.

Receiver 128 receives an IQ signal at the input to amplifier 126, such as via an antenna coupled to the input. In other words, an antenna receives an IQ signal over the air and transfers the signal to amplifier 126 during operation of receiver 128. Receiver 128 then directly down-converts the IQ signal to baseband, producing I-channel data at the output of ADC 144 and Q-channel data at the output of ADC 140. In observing the operation of receiver 128, one may appreciate that receiver 128 has an analog section 134 and a digital section 136.

The I-channel path of transmitter 122 comprises DAC 102, low pass filter 106, and mixer 114. The Q-channel path comprises DAC 110, low-pass filter 112, and mixer 116. Also similar to receiver 128, transmitter 122 has an analog section 108 and a digital section 104. Transmitter 122 then mixes and combines the two signals, amplifies the IQ signal via amplifier 120, and transmits the amplified signal, such as by way of an antenna coupled to the output of amplifier 120.

Any gain or phase mismatches between the I-path and the Q-path may create quadrature imbalance. Quadrature imbalance in either transmitter 122 or receiver 128 can impact the performance of transceiver 100. For example, quadrature imbalance in receiver 128 may reduce the overall signal-to-noise ratio below an acceptable level and increase the bit error rate. In a more specific example, the mixer 130 may have a different amplitude and/or phase characteristic than mixer 132. The differences between the mixers will increase the bit error rate in the resulting I- and Q-baseband signals during demodulation. Similar performance impact may result from other component mismatches, such as gain and/or phase mismatches between the filters 142 and 138, or the ADCs 144 and 140.

FIG. 1 further illustrates a method of calibration that uses a wideband signal to alleviate the problem of quadrature imbalance in transceiver 100. The wideband signal may be an arbitrary transmitted signal, or it may be a "legal" transmitted packet complying with the communications protocol of transceiver 100. Using either of these types of wideband signals, an embodiment of transceiver 100 may perform a calibration even while transceiver 100 is transmitting real "payload" data. As one will appreciate, such online calibration during operation may eliminate the "idle time" associated with systems that cannot perform calibrations while transmitting data.

Transceiver 100 has a phase-shifting module 124 in an added path, called a loopback path. The loopback path directs the transmitted signal from the output of mixers 114 and 116 into analog section 134 of receiver 128. The added loopback path of transceiver 100 may transfer various phase-shifted signals to receiver 128. For example, in some embodiments the loopback path may receive wideband signals from transmitter 122, shift the phase of the wideband signals by various degrees, and transfer the phase-shifted signals to receiver 128. In numerous embodiments, transceiver 100 may use arbitrary values of phase-shift when generating the phase-shifted signals. In at least one alternative embodiment, the wideband signals may be shifted by a fixed-amount. For example, an embodiment may introduce a phase shift of two selectable values, such as shifting the phase by +45° or −45°.

Quadrature imbalance may be treated as a complex-plane operation which can be represented in matrix form:

$$\begin{bmatrix} I' \\ Q' \end{bmatrix} = \begin{bmatrix} \alpha & \beta \\ 0 & 1 \end{bmatrix} \cdot \begin{bmatrix} I \\ Q \end{bmatrix}; \alpha \sim 1; |\beta| \ll 1$$

In the matrix representation, $\alpha$ is the gain imbalance factor and $\beta$ is the phase imbalance factor. For a transceiver using RF loopback with a phase shift, such loopback is equivalent to multiplying three matrices in order:

$$\begin{bmatrix} I' \\ Q' \end{bmatrix} = \begin{bmatrix} \alpha_{RX} & \beta_{RX} \\ 0 & 1 \end{bmatrix} \cdot \begin{bmatrix} \cos(\varphi_{LB}) & \sin(\varphi_{LB}) \\ -\sin(\varphi_{LB}) & \cos(\varphi_{LB}) \end{bmatrix} \cdot \begin{bmatrix} \alpha_{TX} & \beta_{TX} \\ 0 & 1 \end{bmatrix} \cdot \begin{bmatrix} I \\ Q \end{bmatrix};$$

$$N \cdot 90° \neq \varphi_{LB} \neq 0°$$

In the matrices above, $\alpha_{RX}$ and $\alpha_{TX}$ are the gain imbalance factors for receiver 128 and transmitter 122, respectively. $\beta_{RX}$ and $\beta_{TX}$ the phase imbalance factors for receiver 128 and transmitter 122, respectively. $\phi_{LB}$ is the loopback phase-shift.

Transceiver 100 may employ a method for measuring the matrix coefficients that involves using the wideband signal during calibration. For example, transceiver 100 may use Fast Fourier Transform (FFT) calculation and calibration control module 165 in the digital domain or digital section to determine I' and Q'. For example, FFT calculation and calibration control module 165 may convert the received signal from the time domain to the frequency domain. The FFT module may sample the complex received data (element 155) for the received signal at various points in time and use the samples to calculate the signal levels at various frequencies for the received signal from the loopback. The FFT module may also sample the complex transmitted data (element 160) for the transmitted signal at various points in time and use these samples to calculate the signal levels at various frequencies for the transmitted signal.

FFT calculation and calibration control module 165 may sample and record parameters of the two quadrature signals (I/Q) both of receiver 128 and transmitter 122 for two wideband signals, wherein the two wideband signals are generated by shifting the phase of the wideband signal introduced into transmitter 122. In other words, the two wideband signals include different phase-shifts in the RF loopback, introduced by phase-shifting module 124. FFT calculation and calibration control module 165 may sample the transmitted signal (element 160), which will enable the calculation of the complex-frequency content of the transmitted signal. FFT calculation and calibration control module 165 may also sample the received signal (element 155), which will enable the calculation of the complex-frequency content of the received signal.

The information available from the FFT calculation and calibration control module 165 includes the complex (real and imaginary) amplitudes of both the received and transmitted signals. Obtaining the amplitudes in this manner may be equivalent, via a straight-forward algebraic operation, to measuring the correlations between time-domain signals. Transceiver 100 knows the matrix coefficients of the transmitted signal, I and Q, and knows the amount of loopback phase shift. Consequently, transceiver 100 possesses enough information to solve for $\alpha_{RX}$, $\alpha_{TX}$, $\beta_{RX}$, and $\beta_{TX}$.

Various embodiments may extend the aforementioned methodology to solve for $\alpha_{RX}$, $\alpha_{TX}$, $\beta_{RX}$, and $\beta_{TX}$. The embodiments may further enable solving for $\alpha_{RX}$, $\alpha_{TX}$, $\beta_{RX}$, and $\beta_{TX}$ without requiring exact knowledge of the phase shift. Because many transceiver systems may comprise practical, mass-produced, transceiver circuits with all the accompanying circuit variations due to component tolerances, knowing exactly the phase shift may generally pose a serious challenge.

Figure 2:
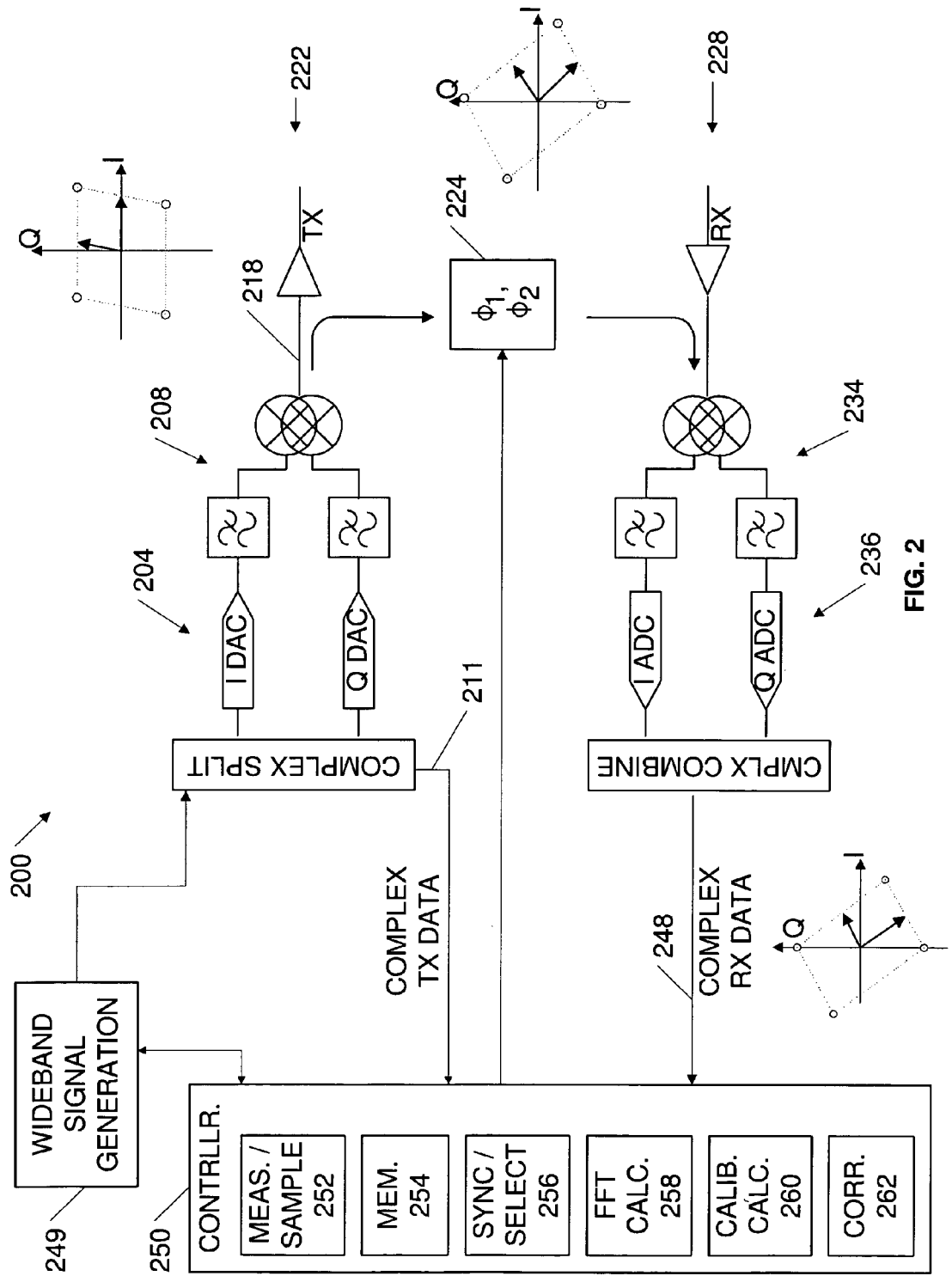
FIG. 2 provides a more detailed embodiment of how a direct conversion transceiver may employ wideband signals to calibrate quadrature imbalance.

FIG. 2 illustrates in more detail how a direct conversion transceiver 200 may employ wideband signals to calibrate quadrature imbalance according to one embodiment. Transceiver 200 may use a wideband signal to perform a calibration to alleviate quadrature imbalance without precisely knowing the phase shift angles used during the calibration process.

Transceiver 200 comprises a direct conversion transmitter 222 and a direct conversion receiver 228. For example, in one embodiment transceiver 200 may comprise a transceiver of a network WAP which wirelessly communicates with other wireless devices in a network according to an 802.11 ac protocol. Receiver 228 has a digital section 236 and an analog section 234, while transmitter 222 has an analog section 208 and a digital section 204. Transceiver 200 has a quadrature calibration controller 250 in the digital section and a phase-shifting module 224 in the RF section. Calibration controller 250 may direct or control the calibration process, manipulating phase-shifting module 224 to inject signals having different phase shift angles into receiver 228.

Transceiver 200 comprises a wideband signal generation module 249 that generates wideband signals. The form of wideband signal generation module 249 may vary in different embodiments. For example, in some embodiments wideband signal generation module 249 may comprise a self-contained generator that generates arbitrary signals. In other embodiments, wideband signal generation module 249 may comprise a modem that generates "payload" data of a protocol, wherein transmitter 222 is configured to transfer the payload data, in a protocol-compliant manner, to other terminals in a network. In further embodiments, wideband signal generation module 249 may generate both arbitrary and payload-type signals.

In a specific example, wideband signal generation module 249 may comprise the signal generation module of a smartphone that takes data of the smartphone and prepares it for transmission over a high speed data network. In the embodiment depicted in FIG. 1, wideband signal generation module 249 comprises an internal digital frequency source. In alternative embodiments, the signal generator may comprise an analog source. For example, in one alternative embodiment, an analog signal generator module may inject a wideband signal into the I- and Q-channel paths between the DACs and the low-pass filters. In other words, the alternative embodiment may ignore any gain and/or phase mismatches associated with the DACs and only correct the effects of quadrature imbalance associated with the remaining components in the I- and Q-channel paths.

As noted, transceiver 200 also comprises phase-shifting module 224 in a loopback path which couples analog section 208 of transmitter 222 to analog section 234 of receiver 228 during calibration. That is to say, during normal operation, phase-shifting module 224 may be isolated from analog section 208 and/or section 234. During calibration, however, calibration controller 250 may couple phase-shifting module 224 to analog sections 208 and 234, such as by closing solid state switches, switching between multiplexer inputs, or activating other switching devices. In some embodiments, phase-switching module 224 may be continually coupled to analog sections 208 and 228, such as by using high impedance output elements for connection to analog section 234.

During calibration of transmitter 222 and receiver 228, wideband signal generation module 249 may transfer the wideband signal into the DACs of transmitter 222. Upon exiting the digital section 204, the wideband signal may propagate through the low-pass filters and mixers of direct conversion transmitter 222. In propagating through the DACs, the filters, and the mixers, the component mismatches may cause a quadrature imbalance for the wideband signal, resulting in an altered signal at node 218. The altered signal at node 218 may be referred to as the transmitter signal.

Calibration controller 250 may cause phase-shifting module 224 to generate a first phase-shifted signal based on the transmitter signal. In other words, the wideband transmitter signal may propagate from node 218 into phase-shifting module 224. Phase-shifting module 224 may shift the phase of the transmitter signal by a first phase-shift angle ($\Phi_1$) to produce the first phase-shifted signal. The first phase-shifted signal may enter the RF portion of receiver 228 via the loopback path. The first phase-shifted signal may propagate through the I- and Q-channel elements of receiver 228, producing a first receiver signal at the outputs of the ADCs.

As the first receiver signal moves from analog section 234 into digital section 236 by exiting the ADCs, calibration controller 250 may measure a first set of parameters via measurement module 252. Measurement model 252 may take numerous samples (element 248) of the digital values produced by the ADCs of receiver 228. Measurement model 252 may also take numerous samples (element 211) of the digital values used to produce the wideband signal for the DACs of transmitter 222. Calibration controller 250 may store these signal samples for the first phase-shifted signal into memory module 254.

FFT calculation module 258 may work in conjunction with synchronization and selection module 256 to retrieve the signal samples and calculate the signal levels at various frequencies for the first phase-shifted signal. Synchronization and selection module 256 may ensure that the samples of the received signals and the transmitted signals, one or both of which may be stored in memory module 254, are synchronized to ensure the quality of the calibration. FFT calculation module 258 may calculate the complex-frequency parameters of both the transmitted signal and the received signal, synchronized via synchronization and selection module 256, wherein the received signal has a first phase shift. Calibration controller 250 may store the calculated complex parameters for the first phase-shifted signal into memory module 254.

Calibration controller 250 may then cause phase-shifting module 224 to generate a second phase-shifted signal based on the wideband transmitter signal. That is to say, phase-shifting module 224 may switch to a second mode of operation and shift the phase of the wideband transmitter signal by a second phase-shift angle ($\Phi_2$), producing a second phase-shifted signal. Calibration controller 250 may measure the signal samples (elements 211 and 248) via measurement module 252 related to the second phase-shifted signal and store the signal samples for the second phase-shifted signal in memory module 254.

FFT calculation module 258 may work in conjunction with synchronization and selection module 256 to retrieve the signal samples and calculate the signal levels at various frequencies for the second phase-shifted signal. In doing so, FFT calculation module 258 may calculate the complex-frequency parameters of both the transmitted signal and the received signal, wherein the received signal has a second phase shift. Calibration controller 250 may store the calculated complex-frequency parameters, calculated for the second phase-shifted signal, into memory module 254.

Calibration calculation module 260 may then use the first and second set of stored parameters in memory module 254 to calculate correction parameters. When calculating the correction parameters, calibration calculation module 260 may be able to determine I' and Q' parameters for the first and second receiver signals, as well as have knowledge of the I and Q parameters that were used during the creation and measurement of the I' and Q' parameters.

The calculated correction parameters may enable calibration controller 250 to calibrate transmitter 222 and receiver 228 for quadrature imbalance via the calculated complex-frequency parameters. For example, calibration controller 250 may comprise internal digital elements in correction module 262 that enable correction of quadrature errors in transmitter 222 and receiver 228. In alternative embodiments, a transceiver may calibrate the transmitter and/or receiver in a different manner. For example, instead of employing solely digital elements in the digital section, calibration controller 250 may instead use the calculated correction parameters to adjust elements in the analog sections, such as phase compensation components and gain compensation components.

The embodiment depicted in FIG. 2 employs digital correction for phase imbalance and gain imbalance correction. Once the correction parameters are calculated for transmitter 222, correction module 262 may take the one or more of the digital values that would otherwise be transferred to the DACs of transmitter 222 without correction, adjust the digital value(s) based on the correction parameters, and transfer the adjusted digital value(s) to the DACs. Correction module 262 may operate in a similar but reverse manner for receiving digital signals from the ADCs.

In different embodiments, correction modules may correct gain or phase imbalance errors in different areas of the transceiver. For example, in some embodiments correction circuits may correct gain imbalance and phase imbalance errors in analog section 208 and/or 234. In other embodiments, a correction module may correct gain and phase imbalance errors in digital section 204 and/or 236. In other words, different embodiments may correct gain and/or phase imbalance errors in different sections of a transceiver.

Figure 3:
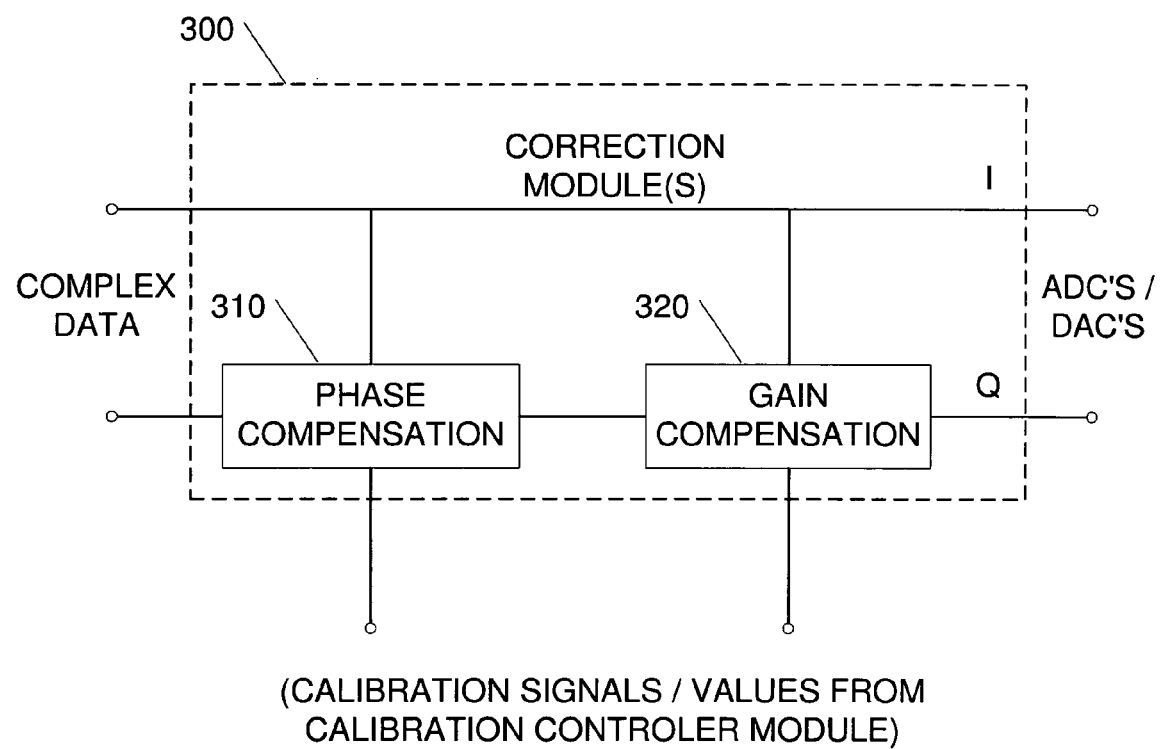
FIG. 3 depicts a correction module that may be used in an embodiment.

An embodiment of a correction module 300 is depicted in FIG. 3. Correction module 300 may correct gain imbalance and phase imbalance errors in digital section 204 or 236. For example, correction module 300 may be located between the complex splitting module and the DACs in digital section 204, or located between the complex combination module and the ADCs in digital section 236. Correction module 300 comprises a phase compensation module 310 and a gain compensation module 320. Based on the calculated correction parameters, correction module 300 may adjust the phase or gain of the signal transferred to/from the DAC/ADC elements.

FIG. 2 and the associated discussion illustrate how calibration controller 250 and phase-shifting module 224 may operate together to create a new set of equations to solve:

$$\begin{bmatrix} I' \\ Q' \end{bmatrix} = A_1 \cdot \begin{bmatrix} \alpha_{RX} & \beta_{RX} \\ 0 & 1 \end{bmatrix} \cdot \begin{bmatrix} \cos(\varphi_{LB,1}) & \sin(\varphi_{LB,1}) \\ -\sin(\varphi_{LB,1}) & \cos(\varphi_{LB,1}) \end{bmatrix} \cdot \begin{bmatrix} \alpha_{TX} & \beta_{TX} \\ 0 & 1 \end{bmatrix} \cdot \begin{bmatrix} I \\ Q \end{bmatrix},$$

and $$\begin{bmatrix} I' \\ Q' \end{bmatrix} = A_2 \cdot \begin{bmatrix} \alpha_{RX} & \beta_{RX} \\ 0 & 1 \end{bmatrix} \cdot \begin{bmatrix} \cos(\varphi_{LB,2}) & \sin(\varphi_{LB,2}) \\ -\sin(\varphi_{LB,2}) & \cos(\varphi_{LB,2}) \end{bmatrix} \cdot \begin{bmatrix} \alpha_{TX} & \beta_{TX} \\ 0 & 1 \end{bmatrix} \cdot \begin{bmatrix} I \\ Q \end{bmatrix},$$

with $$\varphi_{LB,1} \neq \varphi_{LB,2}.$$

Allowing, without loss of generality, the two phase-shift states (one state based on $\phi_{LB,1}$ and one state based on $\phi_{LB,2}$) to have different gain levels, one may observe that eight equations remain to be solved using eight measurements. The eight equations to solve are the two gain imbalance parameters ($\alpha_{RX}$ and $\alpha_{TX}$), the two phase imbalance parameters ($\beta_{RX}$ and $\beta_{TX}$), the two loopback phases ($\phi_{LB,1}$ and $\phi_{LB,2}$), and the two overall gains ($A_1$ and $A_2$) using eight measurements (two I' parameters, two Q' parameters, two I parameters, and two Q parameters for the two states). The equations for the two states are analytically solvable, and no knowledge of the loopback phases or the gains is needed to solve the equations and determine the values of $\alpha_{RX}$, $\alpha_{TX}$, $\beta_{RX}$ and $\beta_{TX}$.

In many embodiments, the switchable-phase element, phase-shifting module 224, may be implemented using a Poly-Phase Filter (PPF). The PPF may provide two differential outputs with a 90° phase offset between the two. Each stage of the PPF may add 45° to the overall phase shift of the filter. So, by choosing either one differential output or the other (for an odd number of stages) or by choosing to add or subtract the two output signals (for an even number of stages) one may generate the two phases reliably using mostly passive elements. Because phase-shifting module 224 may perform the switch in the RF sections, the switching may not generally impact the quadrature imbalance of either the transmitter or the receiver.

Figure 4:
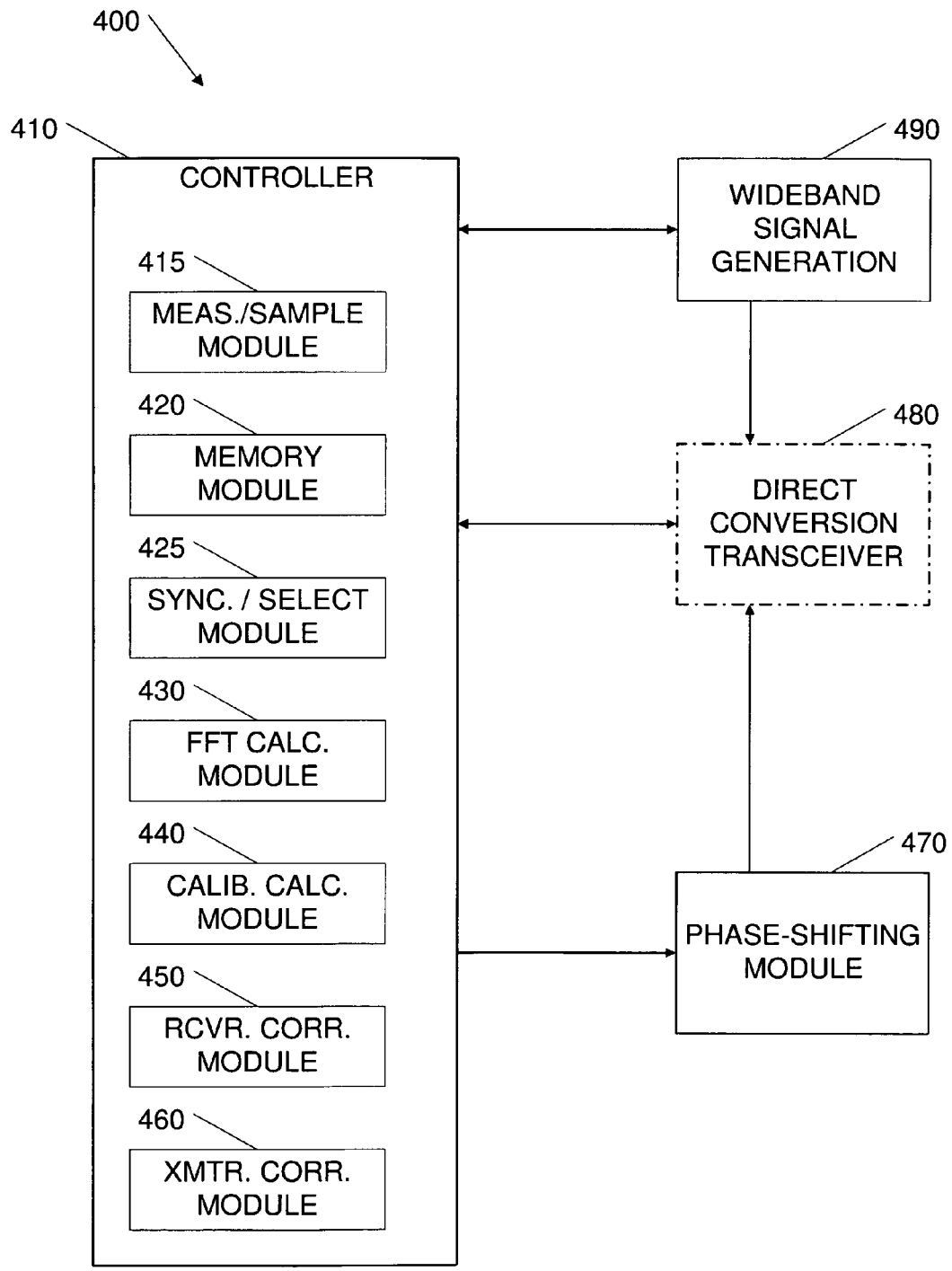
FIG. 4 depicts one embodiment of an apparatus that may use wideband signals to calibrate quadrature imbalance in a direct conversion transceiver.

FIG. 4 depicts one embodiment of an apparatus 400 that may use wideband signals to calibrate quadrature imbalance in transmitters and/or receivers of a direct conversion transceiver 480. For example, apparatus 400 may comprise, or at least form a part of, a wireless network communication device, such as a wireless access point device. With reference to FIG. 2, controller 410 may correspond to calibration controller 250, while phase-shifting module 470 may correspond to phase-shifting module 224. One or more elements of apparatus 400 may be in the form of hardware, software, or a combination of both hardware and software. For example, in the embodiment depicted in FIG. 4, one or more portions of calibration calculation module 440 or FFT calculation module 430 may comprise instruction-coded modules stored in one or more memory devices. For example, the modules may comprise software or firmware instructions of an application in a DSP that employs a microprocessor for performing complex calculations.

Wideband signal generation module 490 may generate the wideband signal that is subsequently phase-shifted and transferred into the receiver. As noted previously, signal generator 420 may be a digital signal generator in some embodiments or an analog signal generator in other embodiments.

In many embodiments, measurement module 415 may comprise buffers or series of memory elements coupled to a status register associated with an ADC or DAC. When triggered by controller 410, measurement module 415 may be configured to store a series of values retrieved from the status register during a cycle of the sampled signal and store the values in memory module 420 for later retrieval for the subsequent calculations. In many embodiments, memory module 420 may comprise dynamic random access memory (DRAM) to store the measured sets of parameters. In some embodiments, memory module 420 may employ another type of memory to store the measured sets of parameters, such as static RAM or flash memory.

Synchronization and selection module 425 may ensure that the samples of the received signals and the transmitted signals, one or both of which may be stored in memory module 420, are synchronized to ensure the quality of the calibration. For example with reference to digital section 204 and/or 236 of FIG. 2, calibration controller 250 may use memory module 254 to store samples of the transmitted signal, while the received signal is input into FFT calculation module 258. Synchronization and selection module 256 may ensure that the received signal and the stored transmitted signal from memory module 254 are synchronized for the FFT calculation. In an alternative embodiment, the received signal may be stored in memory module 254 and the transmitted signal transferred directly into FFT calculation module 258. Some alternative embodiments may eliminate the need to employ memory to store one of the signals while the other is processed by employing a plurality of FFT calculation modules which work in conjunction the synchronization block.

FFT calculation module 430 may calculate the signal levels at various frequencies for the phase-shifted signals from the set of signal samples. That is to say, FFT calculation module 430 may calculate the complex frequency content of both the transmitted signal and the received signal. Calibration calculation module 440 may use the sets of stored parameters to calculate correction parameters. Stated differently, calibration calculation module 440 may be able to determine I' and Q' parameters for the phase-shifted receiver signals, as well as the I and Q parameters that were used during the creation and measurement of the I' and Q' parameters. Using these parameters, calibration calculation module 440 may be able to solve the eight equations for the two gain imbalance parameters ($\alpha_{RX}$ and $\alpha_{TX}$), the two phase imbalance parameters ($\beta_{RX}$ and $\beta_{TX}$), the two loopback phases ($\phi_{LB,1}$ and $\phi_{LB,2}$), and the two overall gains ($A_1$ and $A_2$) using eight measurements (two I' parameters, two Q' parameters, two I parameters, and two Q parameters for the two states).

As noted, calibration calculation module 440 may use the calculated parameters and to determine the values for the correction parameters. In many embodiments, calibration calculation module 440 may comprise a state machine. In alternative embodiments, calibration calculation module 440 may comprise a dedicated processor, such as a microcontroller of an application specific integrated circuit (ASIC) coupled with controller 410.

In the embodiment of FIG. 4, apparatus 400 comprises a controller 410 that employs two correction modules, 450 and 460. Receiver correction module 450 may be dedicated for calibration of the receiver for transceiver 480 based on the calculated calibration parameters. Transmitter correction module 460 may be dedicated for calibration of the transmitter of transceiver 480 based on the calculated calibration parameters. As noted previously, the correction modules may be implemented digitally or in an analog fashion in different embodiments.

The number of modules in an embodiment of apparatus 400 may vary. Some embodiments may have fewer modules than those module depicted in FIG. 4. For example, one embodiment may integrate receiver correction module 450 and transmitter correction model 460 into a single module, or combine FFT calculation module 430 and calibration calculation module 440 into a single module. Further embodiments may include more modules or elements than the ones shown in FIG. 4. For example, an alternative embodiment may include two or more measurement modules and two or more FFT modules, such as an embodiment that employs one measurement per each channel and performs the FFT calculation directly with dedicated FFT modules. Other embodiments may include more of the other modules.

Figure 5:
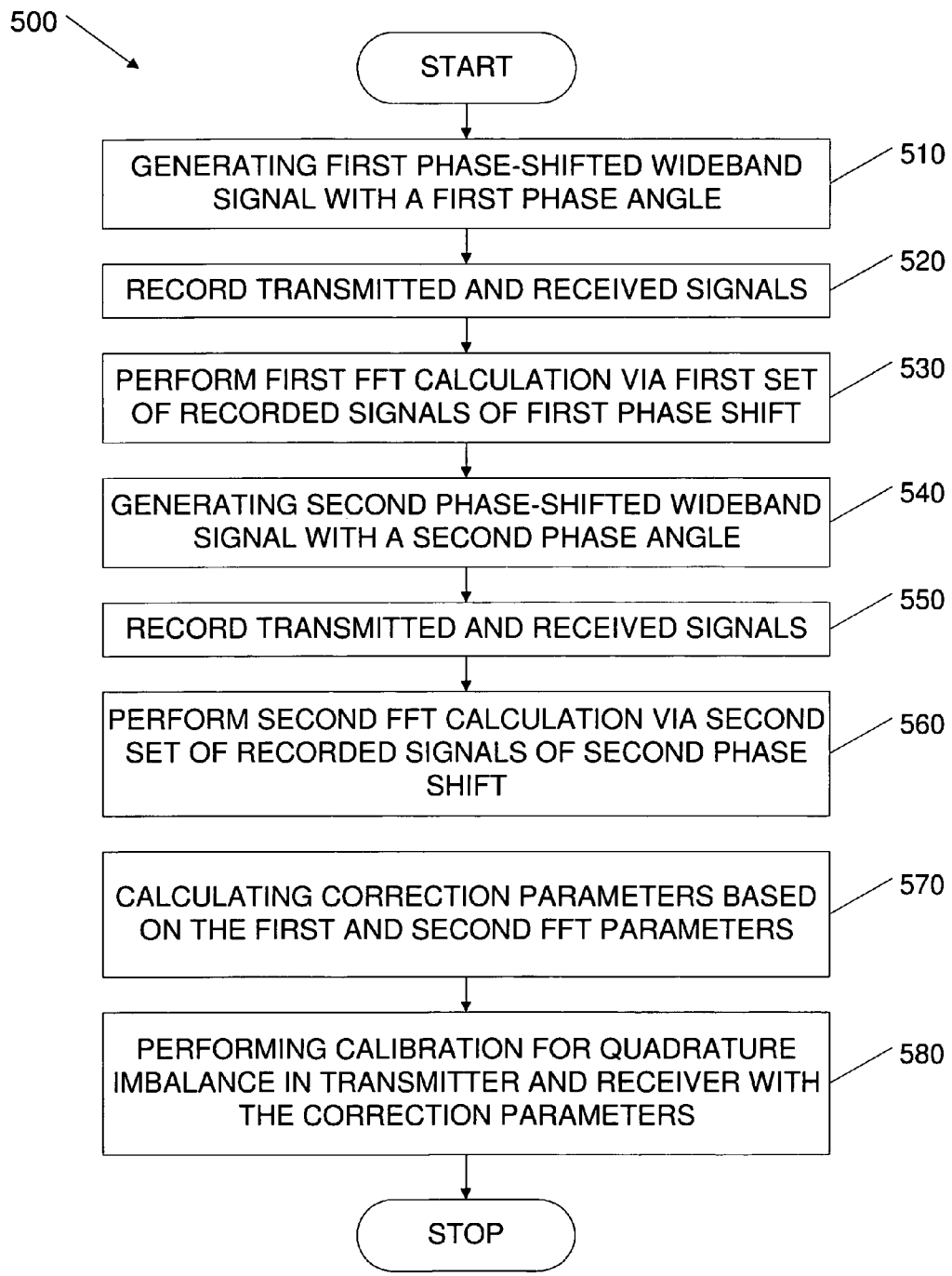
FIG. 5 illustrates a method for calibrating quadrature imbalance in direct conversion transceivers via wideband signals.

FIG. 5 depicts a flowchart 500 illustrating a method for calibrating quadrature imbalance in direct conversion transceivers via wideband signals. Flowchart 500 begins with generating a first phase-shifted wideband signal (element 510). For example with reference to FIG. 2, calibration controller 250 may switch the states of several transistors, causing a loopback path to be created between the analog sections 208 and 234. Phase-shifting module 224 may shift a wideband signal generated by wideband signal generator 249 using a first phase angle ($\Phi_1$), creating the first phase-shifted signal. For example, calibration controller 250 may manipulate phase-shifting module 224, causing phase-shifting module 224 to shift the phase of the transmitter signal exiting the transmitter mixers. In a more detailed example, phase-shifting module 224 may shift the phase of the transmitter signal by a first phase angle of 45°.

The method according to flowchart 500 also includes storing parameters of I/Q signals from a transmitter and a receiver of the direct conversion transceiver for the first phase-shifted signal (element 520). Continuing with our example with reference to FIG. 2, calibration controller 250 may enable measurement module 252 to sample the transmitter and phase-shifted receiver signals (elements 211 and 248) for the first phase-shifted signal. Upon storing the first set of parameters (element 520), an embodiment may perform Fast Fourier Transform calculations using the stored set of measured parameters (element 530). Again continuing with our example, FFT calculation module 258 may work in conjunction with synchronization and selection module 256 to retrieve the signal samples and calculate the signal levels at various frequencies for the phase-shifted signal. FFT calculation module 258 may calculate the complex-frequency content of both the transmitted signals and the received signals.

Calibration controller 250 may then manipulate phase-shifting module 224 and cause phase-shifting module 224 to shift the phase of the transmitter signal (element 540) by a second phase-shift angle ($\Phi_2$), such as −45°. The 45° and −45° phase-shift angles are only for one embodiment. Other embodiments may use two other angles. Calibration controller 250 may record or store the parameters of the I/Q signals for the transmitter and receiver for the second phase-shifted signal (element 550) and perform FFT calculations using the stored set of measured parameters (element 560).

Using the parameters from the FFT calculations for the different phase-shifted signals, the method according to flowchart 500 may involve calculating correction parameters (element 570). Calibration calculation module 260 may use the calculated complex-frequency content of both the transmitted signals and the received signals to calculate correction parameters. For example, calibration calculation module 260 may solve eight equations using eight determined values. Calibration calculation module 260 may solve for the two gain imbalance parameters ($\alpha_{RX}$ and $\alpha_{TX}$), the two phase imbalance parameters ($\beta_{RX}$ and $\beta_{TX}$), the two loopback phases ($\phi_{LB,1}$ and $\phi_{LB,2}$), and two overall gains ($A_1$ and $A_2$). Calibration calculation module 260 may analytically solve the equations for the two states having no knowledge of the loopback phases or the gains and determine the values of $\alpha_{RX}$, $\alpha_{TX}$, $\beta_{RX}$, and $\beta_{TX}$.

The method according to flowchart 500 also comprises performing calibration for quadrature imbalance in the transmitter and receiver (element 580). For example with reference to FIG. 4, controller 410 may comprise internal digital elements in receiver correction module 450 and transmitter correction module 460 that enable correction of quadrature errors in the transmitter and receiver of transceiver 480.

As noted earlier, one or more portions of some embodiments may be implemented as a program product stored in a tangible medium for use with a process to perform operations for processes, such as the processes described in conjunction with apparatus 400 illustrated in FIG. 4. The program(s) of the program product defines functions of the embodiments (including the methods described herein) and may be contained on a variety of data-bearing media. Illustrative data-bearing media include, but are not limited to: (i) information permanently stored on non-writable storage media (e.g., read-only memory devices within a station); and (ii) alterable information stored on writable storage media (e.g., flash memory). Such data-bearing media, when carrying computer-readable instructions that direct the functions of devices or systems, represent elements of some embodiments of the present invention.

In general, the routines executed to implement the embodiments, may be part of an operating system or a specific application, component, program, module, object, or sequence of instructions. The computer program of an embodiment may be comprised of a multitude of instructions that will be translated by a computer into a machine-readable format and hence executable instructions. Also, programs may be comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus a specific embodiment should not be limited to use solely in any specific application identified and/or implied by such nomenclature.

It will be apparent to those skilled in the art having the benefit of this disclosure that the embodiments herein contemplate calibrating quadrature imbalances via wideband signals in direct conversion transceivers. It is understood that the form of the embodiments shown and described in the detailed description and the drawings are to be taken merely as examples. It is intended that the following claims be interpreted broadly to embrace all the variations of the embodiments disclosed.

Although some aspects have been described in detail for some embodiments, it should be understood that various changes, substitutions and alterations can be made herein without departing from the spirit and scope of the embodiments as defined by the appended claims. Although one embodiment may achieve multiple objectives, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed that perform substantially the same function or achieve substantially the same result as the corresponding embodiments described herein may be utilized according to the embodiments herein. Accordingly, the appended claims are intended to include within their scope such processes, machines, manufacture, compositions of matter, means, methods, or steps.

What is claimed is:

1. A method, comprising: generating a first phase-shifted signal in a loopback path from an analog section of a transmitter of a direct conversion transceiver to an analog section of a receiver of the direct conversion transceiver via a wideband signal of the transmitter of the direct conversion transceiver; generating a second phase-shifted signal in the loopback path from the analog section of the transmitter to the analog section of the receiver via the wideband signal, wherein the phase angles of the first and second phase-shifted signals differ, wherein the generating the first and second phase-shifted signals comprises switching a poly-phase filter to a first state to generate the first phase-shifted signal and switching the poly-phase filter to a second state to generate the second phase-shifted signal; measuring in-phase and quadrature signals for the transmitter and the receiver for the first phase-shifted signal and in-phase and quadrature signals for the second phase-shifted signal to store a first set of parameters based upon the measuring; calculating, via at least one Fourier transform calculation, a second set of parameters from the first set of parameters; and calculating correction parameters for quadrature imbalance to adjust an element in the analog section of the transmitter, the receiver, or a combination thereof responsive to the correction parameters by calculating phase imbalance and gain imbalance factors for the transmitter and calculating phase imbalance and gain imbalance factors for the receiver based upon the second set of parameters.

2. The method of claim 1, further comprising: adjusting a plurality of digital elements based on the correction parameters to calibrate the transmitter and the receiver, wherein the generating the first and second phase-shifted signals comprise adding phase shifts to the wideband signal as the transmitter operates, on-line, transmitting a data packet in compliance with a network communication protocol.

3. The method of claim 2, wherein the generating the first phase-shifted signal comprises adding a first phase shift to the wideband signal and the generating the second phase-shifted signal comprises adding a second phase shift to the wideband signal.

4. The method of claim 2, further comprising: uncoupling the loopback path from the transmitter and the receiver and operating the transceiver with the adjusted plurality of digital elements.

5. The method of claim 1, wherein the calculating the second set of parameters comprises determining the complex-frequency components for the amplitudes of both the first and second phase-shifted signals of the transmitter and receiver.

6. An apparatus, comprising: a phase-shifting module configured to generate a first and a second phase-shifted signal via a wideband signal of a direct conversion transceiver in a loopback path from an analog section of a transmitter of the direct conversion transceiver to an analog section of a receiver of the direct conversion transceiver, wherein further the phase angles of the first and second phase-shifted signals differ, wherein the phase-shifting module comprises a poly-phase filter with at least two differential outputs, wherein further a first differential output is configured to generate the first phase-shifted signal and a second differential output is configured to generate the second phase-shifted signal; a measurement module configured to measure and store a first set of parameters comprising samples from the first phase-shifted signal of in-phase and quadrature signals and samples from the second phase-shifted signals of in-phase and quadrature signals for the transmitter and the receiver; a Fourier transform module configured to calculate a second set of parameters from the first set of parameters; and a calibration module configured to calculate, via the second set of parameters, correction parameters for quadrature imbalance by calculating phase imbalance and gain imbalance factors for the transmitter and calculating phase imbalance and gain imbalance factors for the receiver based upon the second set of parameters, the calibration module being further configured to adjust an element in the analog section of the transmitter, the receiver, or a combination thereof responsive to the correction parameters wherein each of the phase-shifted signals include an in-phase component and a quadrature component.

7. The apparatus of claim 6, further comprising a synchronization module coupled to the Fourier transform module, the synchronization module configured to synchronize the first set of parameters for the Fourier transform module calculation of the second set of parameters.

8. The apparatus of claim 7, further comprising a digital signal processor (DSP) directly coupled to the calibration module, the DSP to control the calibration module during quadrature calibration.

9. The apparatus of claim 8, further comprising a receiver correction module and a transmitter correction module, wherein the DSP is configured to adjust operational parameters of the receiver correction module and the transmitter correction module based on the correction parameters.

10. The apparatus of claim 6, further comprising a memory module configured to store the first and second set of parameters of the measurement module, wherein further the memory module comprises at least one of dynamic random access memory (DRAM) and static RAM (SRAM).

11. The apparatus of claim 10, further comprising a wideband signal generator coupled to inputs of digital-to-analog converters of the transmitter, the wideband signal generator configured to generate the wideband signal for the transmitter.

12. The apparatus of claim 11, wherein the measurement module comprises a digital sampling module, wherein further the measurement module is configured to sample each of the in-phase and quadrature signals from the digital sections of both the transmitter and the receiver a plurality of times to obtain the first set of parameters.

13. The apparatus of claim 12, wherein the second set of parameters comprise complex-frequency parameters of the corresponding first set of parameters, wherein further the first set of parameters comprise time-domain samples for the in-phase and quadrature signals of the first and second phase-shifted signals of the transmitter and the receiver.

14. The apparatus of claim 13, wherein the calibration module is configured to calculate the correction parameters while the transmitter is on-line and transmitting packets of payload data to a network communication device.

15. A system, comprising: a direct conversion transceiver coupled to at least one antenna; a phase shifting module configured to generate a first and a second phase-shifted signal via a wideband signal of a transmitter of the direct conversion transceiver in a loopback path from an analog section of the transmitter to an analog section of a receiver of the direct conversion transceiver, wherein further the phase angles of the first and second phase-shifted signals differ, wherein the phase-shifting module comprises a poly-phase filter with at least two differential outputs, wherein further a first differential output is configured to generate the first phase-shifted signal and a second differential output is configured to generate the second phase-shifted signal; a measurement module configured to measure and store a first set of parameters comprising samples from the first phase-shifted signal of in-phase and quadrature signals and samples from the second phase-shifted signals of in-phase and quadrature signals from digital sections of the transmitter and the receiver of the direct conversion transceiver; a Fourier transform module configured to calculate a second set of parameters from the first set of parameters; and a calibration module configured to calculate, via the second set of parameters, correction parameters for quadrature imbalance, the calibration module being further configured to adjust an element in the analog section of the transmitter, the receiver, or a combination thereof responsive to the correction parameters by calculating phase imbalance and gain imbalance factors for the transmitter and calculating phase imbalance and gain imbalance factors for the receiver based upon the second set of parameters.

16. The system of claim 15, wherein the direct conversion transceiver comprises a media access control (MAC) module configured to communicate with an 802.11g wireless network.

17. The system of claim 15, wherein the at least one antenna comprises a cell phone antenna.

18. The system of claim 15, wherein the direct conversion transceiver comprises a first plurality of antennas coupled to the transmitter and a second plurality of antennas coupled to the receiver, wherein the first and second plurality of antennas comprise elements of a multiple-input and multiple-output (MIMO) system.

* * * * *